United States Patent
Hsieh et al.

(10) Patent No.: US 11,658,052 B2
(45) Date of Patent: *May 23, 2023

(54) CHIP TRANSFERRING METHOD AND THE APPARATUS THEREOF

(71) Applicant: EPISTAR CORPORATION, Hsinchu (TW)

(72) Inventors: Min-Hsun Hsieh, Hsinchu (TW); De-Shan Kuo, Hsinchu (TW); Chang-Lin Lee, Hsinchu (TW); Jhih-Yong Yang, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/367,067

(22) Filed: Jul. 2, 2021

(65) Prior Publication Data
US 2021/0335641 A1 Oct. 28, 2021

Related U.S. Application Data

(63) Continuation of application No. 16/257,886, filed on Jan. 25, 2019, now Pat. No. 11,056,368.

(30) Foreign Application Priority Data

Jan. 25, 2018 (TW) .................................. 107102652

(51) Int. Cl.
*H01L 21/677* (2006.01)
*H01L 33/00* (2010.01)
(Continued)

(52) U.S. Cl.
CPC .... *H01L 21/67721* (2013.01); *H01L 21/6773* (2013.01); *H01L 21/67144* (2013.01);
(Continued)

(58) Field of Classification Search
CPC ........... H01L 21/67721; H01L 21/6773; H01L 21/6836; H01L 33/0075
See application file for complete search history.

(56) References Cited

U.S. PATENT DOCUMENTS 3,751,647 A * 8/1973 Maeder ............... H01L 27/0203
713/401
4,941,255 A * 7/1990 Bull ...................... H01L 23/544
257/E21.705
(Continued)

FOREIGN PATENT DOCUMENTS

TW 200409272 A 6/2004
TW 395281 5/2013
(Continued)

*Primary Examiner* — Lynn E Schwenning
(74) *Attorney, Agent, or Firm* — Ditthavong, Steiner & Mlotkowski

(57) ABSTRACT

A chip transferring method includes providing a plurality of chips on a first load-bearing structure; measuring a photoelectric characteristic value of each of the plurality of chips; categorizing the plurality of chips into a first portion chips and a second portion chips according to the photoelectric characteristic value of each of the plurality of chips; providing a second load-bearing structure; weakening a first adhesion between the first portion chips and the first load-bearing structure or between the second portion chips and the first load-bearing structure; and transferring the first portion chips or the second portion chips to the second load-bearing structure.

20 Claims, 12 Drawing Sheets

(51) Int. Cl.
*H01L 21/683* (2006.01)
*H01L 21/67* (2006.01)

(52) U.S. Cl.
CPC .... *H01L 21/67288* (2013.01); *H01L 21/6836* (2013.01); *H01L 33/0075* (2013.01); *H01L 2221/68322* (2013.01); *H01L 2221/68354* (2013.01); *H01L 2221/68368* (2013.01)

(56) References Cited

U.S. PATENT DOCUMENTS

| | | | |
|---|---|---|---|
| 5,240,866 A | 8/1993 | Friedman et al. | |
| 5,298,433 A | 3/1994 | Furuyama | |
| 5,838,951 A | 11/1998 | Song | |
| 6,140,151 A * | 10/2000 | Akram | H01L 21/6836 438/464 |
| 6,676,491 B2 | 1/2004 | Arai et al. | |
| 6,998,867 B1 | 3/2006 | Merwah | |
| 8,714,227 B2 * | 5/2014 | Hsu | H01L 22/20 156/716 |
| 9,011,638 B2 * | 4/2015 | Hsu | H01L 21/67005 156/719 |
| 9,229,065 B2 * | 1/2016 | Wu | G01R 31/44 |
| 9,589,086 B2 | 3/2017 | Luoh et al. | |
| 10,032,827 B2 | 1/2018 | Zhu et al. | |
| 9,887,119 B1 * | 2/2018 | Horibe | H01L 21/78 |
| 11,056,368 B2 * | 7/2021 | Hsieh | H01L 21/67721 |
| 2004/0020040 A1 | 2/2004 | Arneson et al. | |
| 2004/0154733 A1 | 8/2004 | Morf | |
| 2005/0158009 A1 * | 7/2005 | Eichelberger | H01L 21/56 257/E23.068 |
| 2008/0108262 A1 * | 5/2008 | Asai | B26F 3/004 428/343 |
| 2010/0252186 A1 * | 10/2010 | Sheats | H01L 21/6835 156/386 |
| 2011/0017407 A1 * | 1/2011 | Hsu | H01L 21/67271 156/704 |
| 2012/0022687 A1 * | 1/2012 | Chen | H01L 21/67271 414/800 |
| 2015/0179520 A1 | 6/2015 | Sadaka et al. | |
| 2017/0215280 A1 | 7/2017 | Chaji | |
| 2018/0261582 A1 * | 9/2018 | Henry | H01L 33/62 |

FOREIGN PATENT DOCUMENTS

| | | |
|---|---|---|
| TW | 201518710 A | 5/2015 |
| TW | 201642961 A | 12/2016 |

* cited by examiner

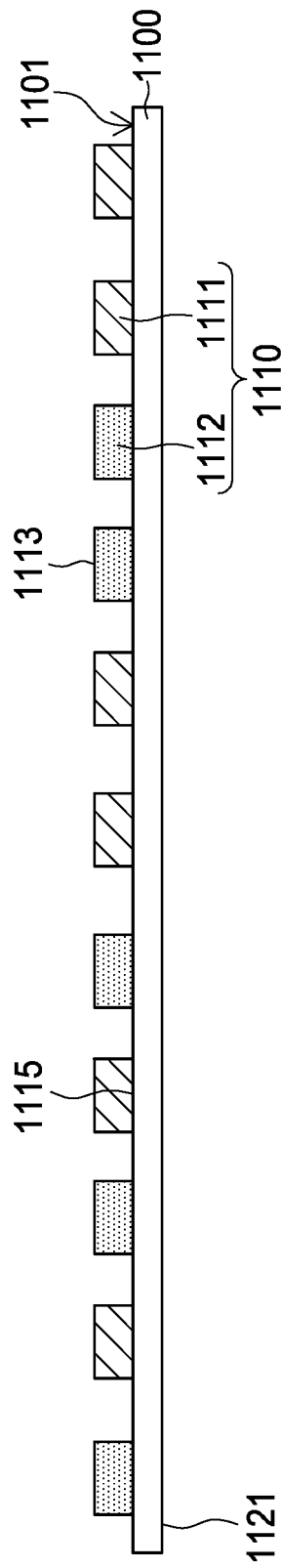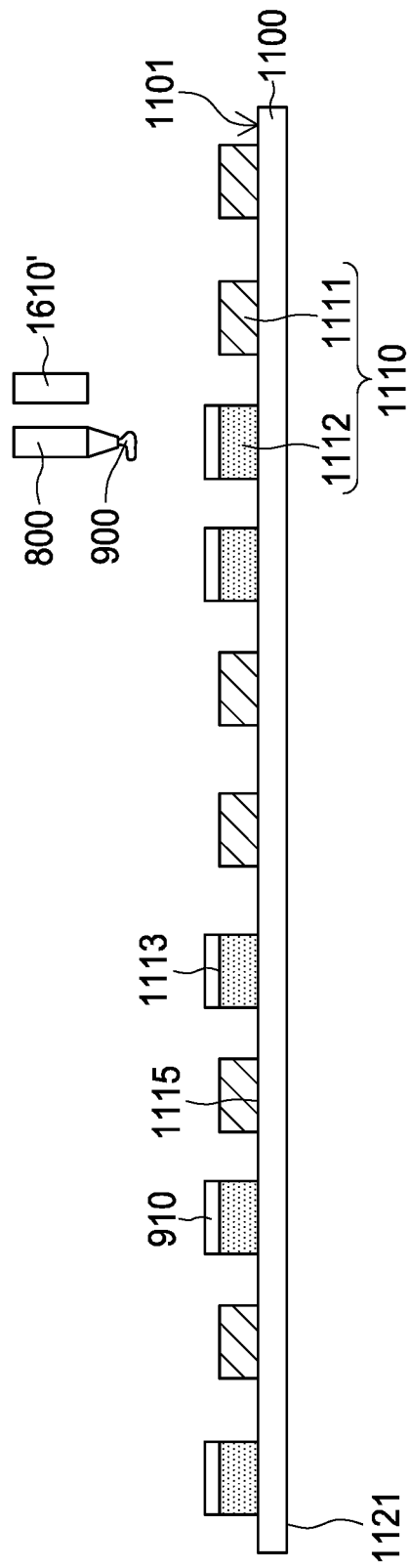
FIG. 3A
FIG. 3B

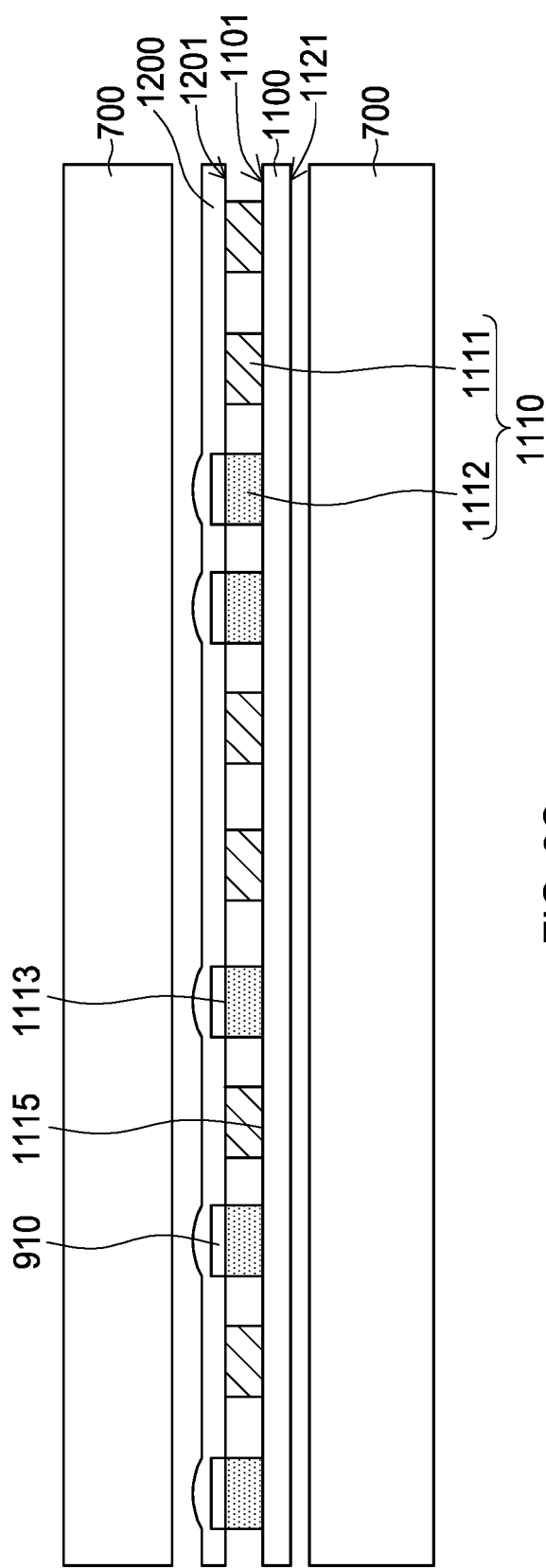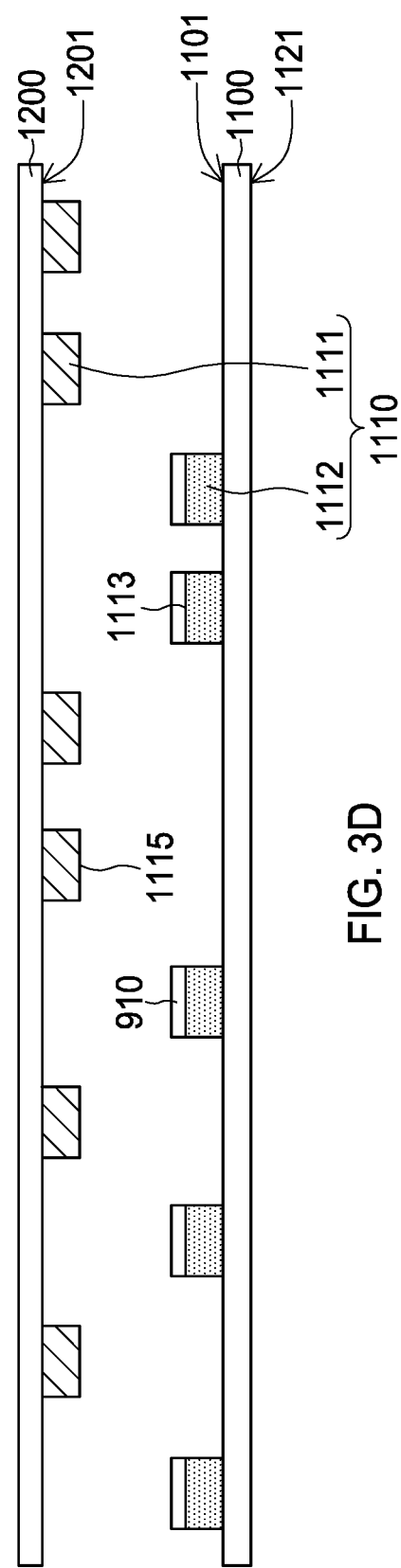

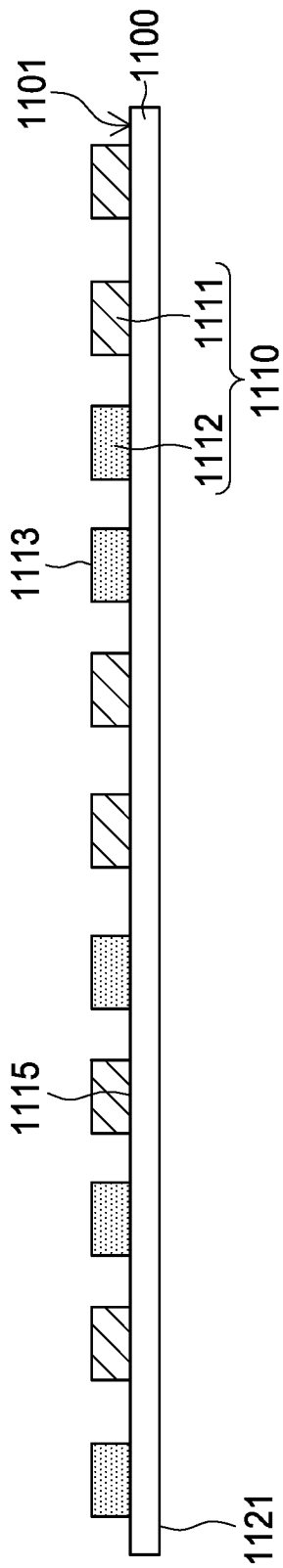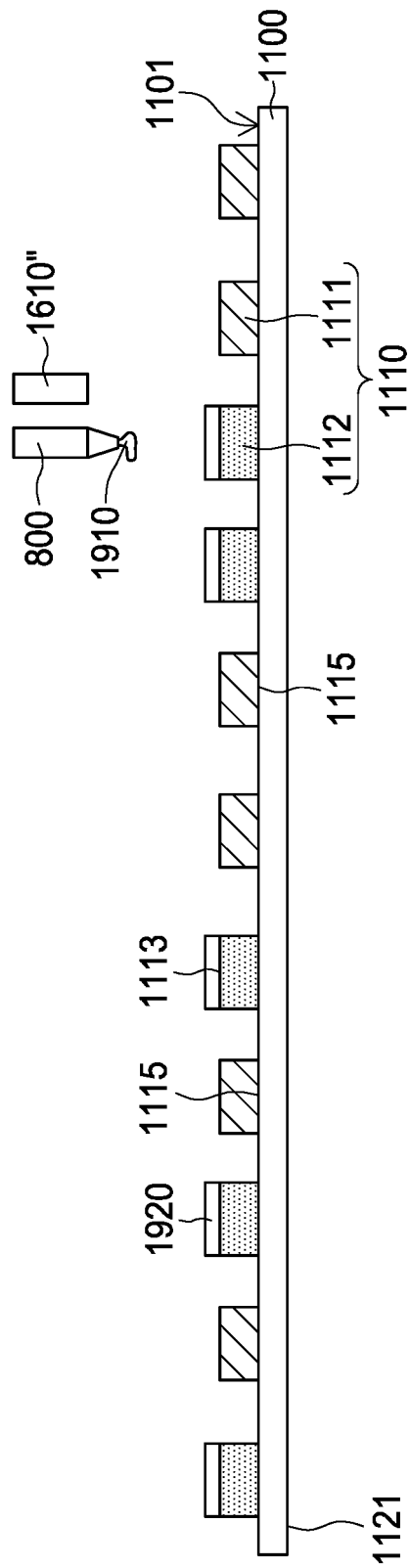

CHIP TRANSFERRING METHOD AND THE APPARATUS THEREOF

CROSS-REFERENCE TO RELATED APPLICATIONS

This present application is a continuation application of U.S. patent application Ser. No. 16/257,886, filed on Jan. 25, 2019, claiming the benefit of priority of TW Patent Application No. 107102652 filed on Jan. 25, 2018, the entirety of which is incorporated by reference herein.

TECHNICAL FIELD

The present disclosure relates to a chip transferring method and the apparatus thereof, in particular to the chip transferring method and the apparatus thereof for light-emitting-diode chips.

DESCRIPTION OF THE RELATED ART

During the process for making semiconductor chips, each wafer is completed through several to hundreds processes, and the completed wafer is divided into a plurality of regions, which is then diced into a plurality of chips. Before or after dicing, the regions need to undergo a series of tests to confirm the characteristic values of different characteristics so as to ensure that the specifications of the produced chips meet the requirements. Taking the light-emitting-diode chips as an example, after the epitaxy is grown on the substrate, the electrodes are formed on the epitaxy by an evaporation process, and then the scribing lines are formed in the epitaxy by photolithography and etching processes to define a plurality of regions. The plurality of regions separated by the scribing lines is then diced into a plurality of separated chips. After the photoelectric characteristic values of the plurality of chips are tested by the probe, the test results are recorded into a wafer map file by a classification code, and according to the customer or the user's requirements, the plurality of chips is categorized based on the wafer map file. When categorizing, the data on the wafer map file firstly corresponds to each chip, and the required chips are sorted and picked one by one by a sorter, and then put on a collecting film of a bin table. The pick-and-put action is repeated till the categorizing is completed. However, in the sorting process by the sorter, it takes a lot of time for the robot of the sorter to travel between the wafer and the bin table. Taking a commercial sorting machine as an example, only four chips can be picked out per second. It takes about three hours to complete the entire categorizing process for a wafer containing 40,000 chips, which affects the manufacturing efficiency.

SUMMARY OF THE DISCLOSURE

A chip transferring method includes providing a plurality of chips on a first load-bearing structure; measuring a photoelectric characteristic value of each of the plurality of chips; categorizing the plurality of chips into a first portion chips and a second portion chips according to the photoelectric characteristic value of each of the plurality of chips; providing a second load-bearing structure; weakening a first adhesion between the first portion chips and the first load-bearing structure or between the second portion chips and the first load-bearing structure; and transferring the first portion chips or the second portion chips to the second load-bearing structure.

BRIEF DESCRIPTION OF THE DRAWINGS

FIGS. 3A to 3D are flowcharts of single-batch transfer of the plurality of chips in accordance with a first embodiment of the present disclosure.

FIGS. 5A to 5D are flowcharts of single-batch transfer of the plurality of chips in accordance with a second embodiment of the present disclosure.

DETAILED DESCRIPTION OF THE EMBODIMENTS

Figure 1:
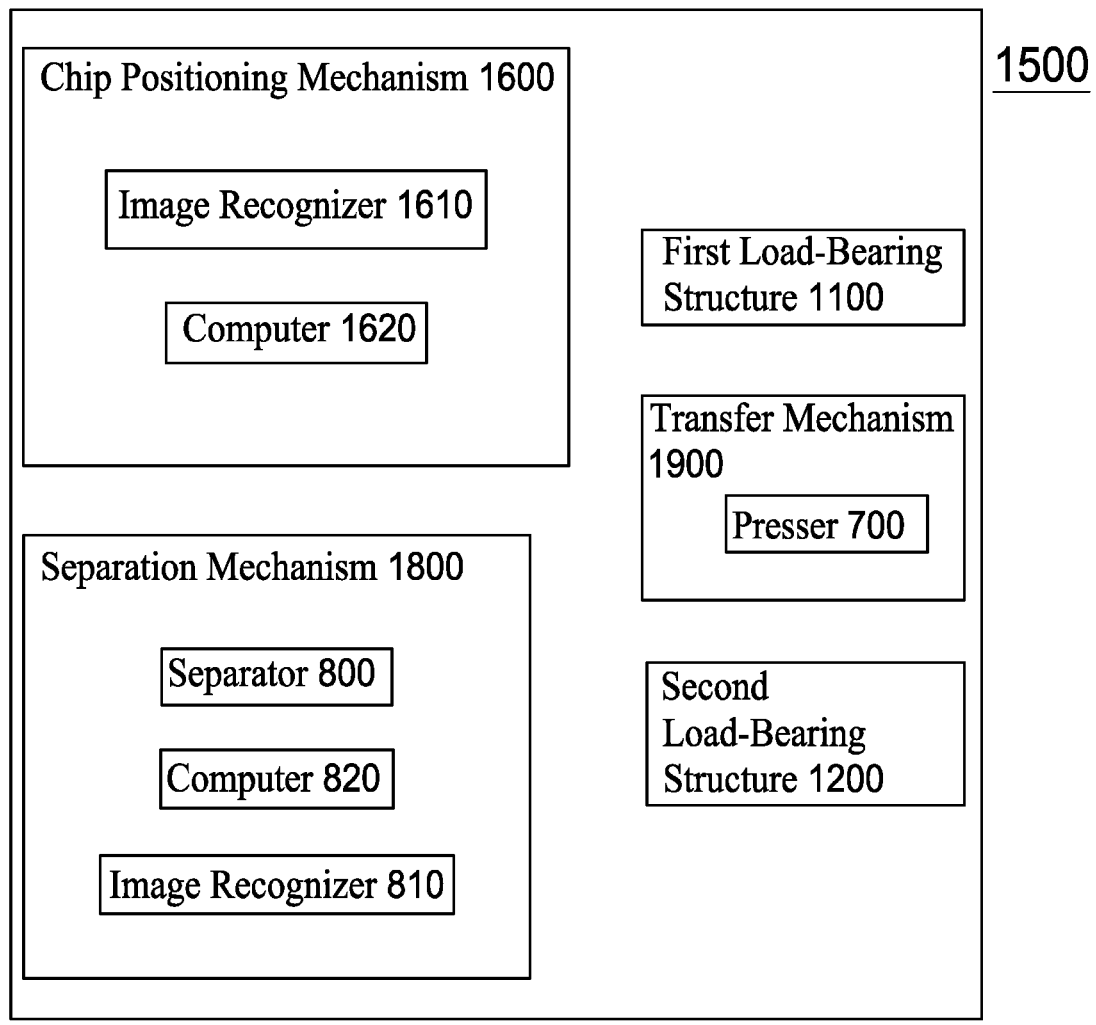
FIG. 1 is a block diagram of a chip transferring apparatus in accordance with a first embodiment of the present disclosure.

The following embodiments, in conjunction with the accompanying drawings, will illustrate the concept of the present disclosure. In the drawings or the description, similar or identical portions are denoted by the same reference numerals, and in the drawings, the shape or thickness of the elements can be enlarged or reduced. Particularly, elements not shown or described in the drawings can be known to those skilled in the art.

FIG. 1 discloses a chip transferring apparatus 1500 in accordance with a first embodiment of the present disclosure, wherein the components included in the chip transferring apparatus 1500 are illustrated in block diagrams. The chip transferring apparatus 1500 includes a first load-bearing structure 1100, a chip positioning mechanism 1600 which includes an image recognizer 1610 such as charge coupled device (CCD) and a computer 1620, a separation mechanism 1800 which includes a separator 800, an image recognizer 810 and a computer 820, a second load-bearing structure 1200 and a transfer mechanism 1900 which include a presser 700.

Figure 2:
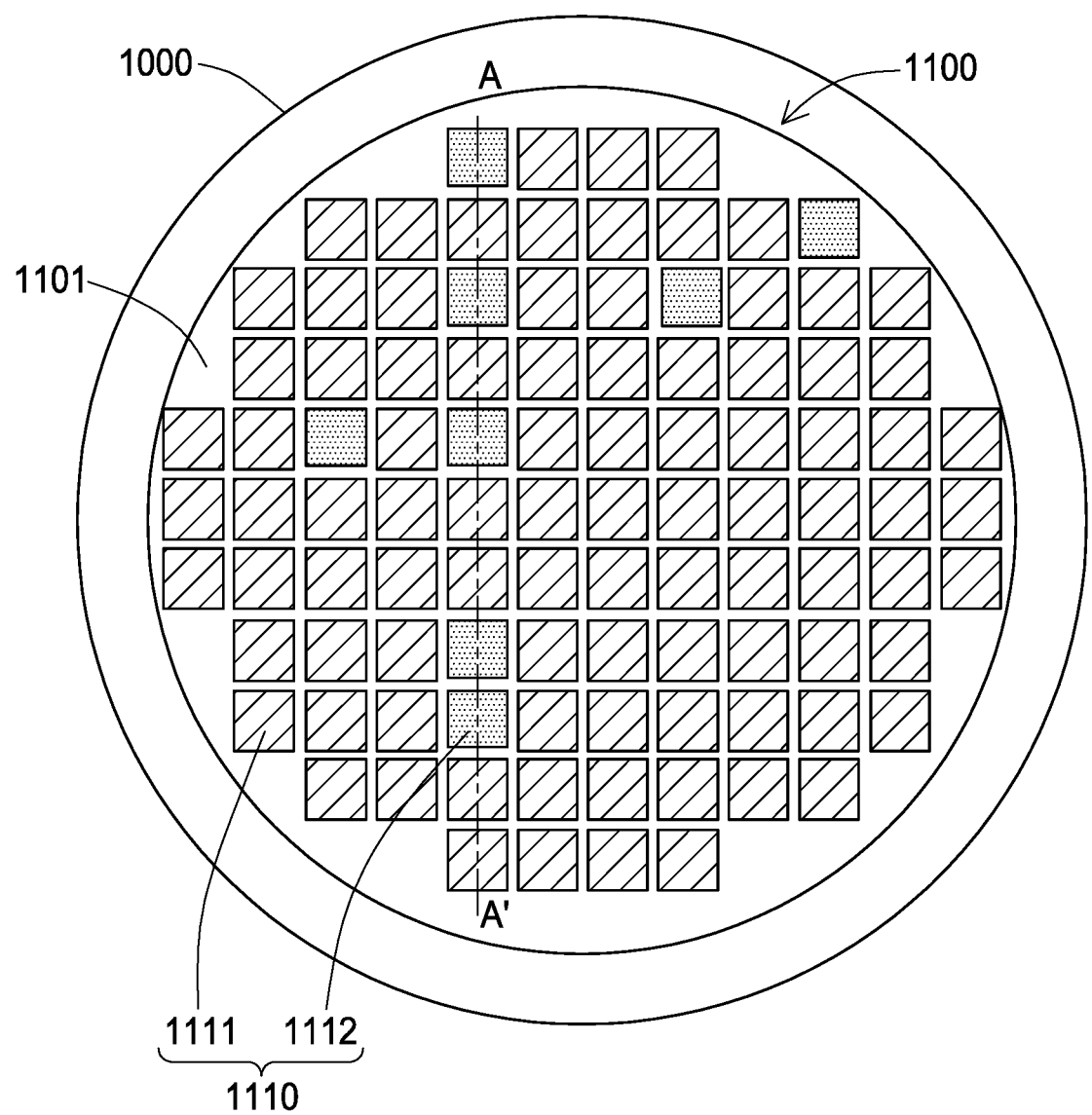
FIG. 2 is a top view of the first load-bearing structure disclosed in the first embodiment of the present disclosure.

FIG. 2 is a top view of the first load-bearing structure 1100 in accordance the first embodiment of the present disclosure. As shown in FIG. 2, the first load-bearing structure 1100 has the function of fixing and bearing the chips. For example, the first load-bearing structure 1100 includes a structure with a surface having adhesive material, such as an adhesive tape, formed thereon. In an embodiment, the adhesive tape is selected from a white film tape, a blue film tape or a UV tape. In the embodiment, the blue film tape is used. The first load-bearing structure 1100 includes a first surface 1101 which is adhesive. In the following process, the chips can be fixed by the adhesion of the first surface 1101. In an embodiment, the first load-bearing structure 1100 is fixed on a metal expansion ring 1000, and then expanded by the metal expansion ring 1000 to increase the distance among the chips on the blue film tape of the first load-bearing structure 1100 so as to facilitate the subsequent transferring process. As shown in FIG. 2, the first surface 1101 of the first load-bearing structure 1100 bears a plurality of chips 1110, such as LED chips, solar-cell chips or transistor chips, which undergoes dicing and expansion process. In the embodiment, LED chips 1110 are used. The material of the LED chips 1110 includes $Al_xIn_yGa_{(1-x-y)}N$ or $Al_xIn_yGa_{(1-x-y)}P$, wherein $0 \leq x, y \leq 1$ and $(x+y) \leq 1$. When the material of the LED chips 1110 includes AlInGaP, red light with a wavelength between 610 nm and 650 nm or green light with a wavelength between 530 nm and 570 nm can be emitted. When the material of the LED chips 1110 includes InGaN, blue light with a wavelength between 400 nm and 490 nm can be emitted. Or when the material of the LED chips 1110 includes AlGaN or AlInGaN, UV light with a wavelength between 250 nm and 400 nm can be emitted. In the embodiment, the light emitted from the LED chips 1110 is blue light. The LED chips 1110 with other emission color can also be applied to other embodiments of the present disclosure.

Next, each of the LED chips 1110 undergoes multiple detections for photoelectric characteristic values. In the embodiment, the detected photoelectric characteristic values of the LED chips 1110 include a luminescence, a light-emitting wavelength, an operating voltage, an electric current, and so on. The photoelectric characteristic values of all LED chips 1110 after the detections form many wafer map files based on the positions of the LED chips on the first load-bearing structure 1100 and the photoelectric characteristic values thereof. Taking the luminescence as an example, a wafer map file is formed by the luminescence of the LED chips in accordance with the positions. Each of the detected photoelectric characteristic value or a combination thereof can be subsequently used as an index for specification categorization. In the embodiment, the dominant wavelength ($W_d$) is used as an index for specification categorization of the photoelectric characteristic values. According to the specification control mechanism of the products, the dominant wavelength of the qualified LED chips 1110 is defined as 450±10 nm, that is, 440 nm to 460 nm, and the LED chips 1110 with the dominant wavelength under 440 nm or above 460 nm are defined as the unqualified chips, i.e. the chips with unqualified photoelectric characteristic values.

The above-mentioned photoelectric characteristic values detection can also be repeated according to other characteristic values such as the luminescence, the operating voltage, or the electric current. After detecting the photoelectric characteristic values of each of the LED chips 1110 one by one, according to the detection result of the characteristic values, the photoelectric characteristic values of each of the LED chips 1110 disposed on the first surface 1101 of the first load-bearing structure 1100 are recorded in the wafer map file based on the positions of the LED chips 1110. In the embodiment, according to the wafer map file of the dominant wavelength of each LED chip, the LED chips 1110 with the dominant wavelength $W_d$ between 440 nm and 460 nm are defined as the qualified chips 1111, and the LED chips 1110 with the dominant wavelength $W_d$ under 440 nm ($W_d < 440$ nm) or above 460 nm ($W_d > 460$ nm) are defined as the unqualified chips 1112. In an embodiment, the dominant wavelength of the qualified chips 1111 can be further divided into a plurality of subranges according to the user's requirements.

FIGS. 3A to 3D are flowcharts of single-batch transfer of a plurality of chips in accordance with the first embodiment of the present disclosure. FIG. 3A is a cross-sectional view of the first load-bearing structure 1100 taken along A-A' in the FIG. 2. As shown in FIG. 3A, the first surface 1101 of the first load-bearing structure 1100 bears a plurality of LED chips 1110 thereon. Each of the LED chips 1110 includes a top surface 1113 and an attaching surface 1115 opposite to the top surface 1113, and the LED chips 1110 are attached to the first surface 1101 with the attaching surface 1115. The first load-bearing structure 1100 further includes a back surface 1121 opposite to the first surface 1101. Referring to FIG. 3A, the first load-bearing structure 1100 bears a first portion of the plurality of LED chips categorized as the qualified chip 1111 whose photoelectric characteristic value (for example, dominant wavelength) falls within the qualified range, and a second portion of the plurality of LED chips categorized as the unqualified chips 1112 whose photoelectric characteristic value (for example, dominant wavelength) falls within the unqualified range.

Next, as shown in FIG. 3B, during the process of transferring the plurality of chips, the image recognizer 1610 of the chip positioning mechanism 1600 shown in FIG. 1, such as a chip locator 1610' in the embodiment, is used to confirm the relative positions of the plurality of LED chips 1110 on the first load-bearing structure 1110, and the computer 1620 is used to construct and apply the wafer map file of the photoelectric characteristic values of the plurality of LED chips 1110 so as to distinguish the positions of the qualified chips 1111 and the unqualified chips 1112 and then feed it back to the separation mechanism 1800. The computer 820 of the separation mechanism 1800 sets a path according to the aforementioned wafer map file. As shown in FIG. 3B, the separator 800 of the separation mechanism 1800, such as a liquid coating device in the embodiment, coats a liquid 900, such as an adhesion reducing agent, on the top surface 1113 (opposite to the attaching surface 1115) of each of the unqualified chips 1112 according to the path set by the computer 820. The liquid 900 solidifies on the top surface 1113 of each of the unqualified chips 1112 to form a thin film 910 whose surface characteristic is different from that of the top surface 1113. Next, referring to FIG. 3C, the second load-bearing structure 1200 is disposed on the top surface 1113 of the LED chips 1110. The second load-bearing structure 1200 has the function of fixing and bearing the chips. For example, the second load-bearing structure 1200 includes a structure with a surface having adhesive material, such as an adhesive tape, formed thereon. In an embodiment, the adhesive tape is selected from a white film tape, a blue film tape, or a UV tape. In the embodiment, the blue film tape is used. The second load-bearing structure 1200 includes a second surface 1201 which is adhesive and facing the top surfaces 1113 of the plurality of LED chips 1110 and the first surface 1101 of the first load-bearing structure 1100. In an embodiment, the thin film 910 includes a surface characteristic different from that of the top surface 1113. In the embodiment, a first adhesion exists between the thin film 910 and the second surface 1201 of the second load-bearing structure 1200, a second adhesion exists between the top surfaces 1113 of the plurality of LED chips 1110 and the second surface 1201 of the second load-bearing structure 1200, and the first adhesion is weaker than the second adhesion. In an embodiment, a third adhesion exists between the attaching surfaces 1115 of the plurality of LED chips 1110 and the first surface 1101 of the first load-bearing structure 1100, and the third adhesion is stronger than the first adhesion. In an embodiment, the third adhesion is weaker than or equal to the second adhesion. As shown in FIG. 3D, when the first surface 1101 of the first load-bearing structure 1100 and the second face 1201 of the second load-bearing structure 1200 are pressed together by the presser 700 of the transfer mechanism 1900, the unqualified chips 1112 are not attached to and transferred by the second surface 1201 of the second load-bearing structure 1200 because of the thin film 910 on the top surfaces 1113 of the unqualified chips 1112 causing the first adhesion between the thin film 910 and the second surface 1201 of the second load-bearing structure 1200 weaker than the third adhesion between the attaching surface 1115 of the LED chips 1110 and the first surface 1101 of the first load-bearing structure 1100. Therefore, the unqualified chips 1112 would remain on the first load-bearing structure 1100. In contrast, the top surfaces 1113 of the qualified chips 1111 would be attached to the second surface 1201 of the second load-bearing structure 1200 by the presser 700 pressing the first load-bearing structure 1100 and the second load-bearing structure 1200, wherein the third adhesion is weaker than the second adhesion in the embodiment, so the qualified chips 1111 would be separated from the first surface 1101 the first load-bearing structure 1100 and transferred to the second surface 1201 of the second load-bearing structure 1200 from the first surface 1101 of the first load-bearing structure 1100 in one batch (single-batch).

In an embodiment, the liquid 900 is coated on the chip's surface, and solidifies to form the thin film 910 after rested for a while. In an embodiment, the process to form the thin film 910 includes removing some solvent from the liquid 900. After the solvent is removed from the liquid 900, the liquid 900 solidifies to form the thin film 910. Then, the first load-bearing structure 1100 and the second load-bearing structure 1200 are pressed together by the presser 700. As such, the transfer yield of the single-batch transfer of chips can be increased. In the embodiment, the rest time is about 20 minutes to 1 hour.

In an embodiment, when the qualified chips 1111 are transferred by the second surface 120 of the second load-bearing structure 1200, the transfer effect can be enhanced by a peptization process removing the adhesion between the surface 1101 and the qualified chips 1111, which means the third adhesion is further weakened. In an embodiment, the peptization process means coating a peptizer, such as acetone, on places of the first surface 1101 or the back surface 1121 of the first load-bearing structure 1100 corresponding to the attaching positions of the qualified chips 1111 to remove the adhesion of the first surface 1101 of the first load-bearing structure 1100. Or, when the first load-bearing structure 1100 includes a UV type, the peptization process means illuminating the places of the first load-bearing structure 1100 corresponding to the attaching position of the qualified chips 1111 with UV light to remove the adhesion between the first surface 1101 of the first load-bearing structure 1100 and the qualified chips 1111.

In an embodiment, the single-batch transfer is accomplished by the adhesion difference between the surfaces of the two load-bearing structures. When the adhesion difference between the second surface 1201 of the second load-bearing structure 1200 and the first surface 1101 of the first load-bearing structure 1100 is larger than 0.4 newton (N), the second load-bearing structure 1200 can attach the qualified chips 1111 from the first surface 1101 to the second surface 1201 by the adhesion of the second surface 1201. The adhesion difference between the first load-bearing structure 1100 and the second load-bearing structure 1200 can be achieved by selecting the material of the two load-bearing structures with different adhesion from each other or by the aforementioned peptization process. The adhesion difference between the two load-bearing structures varies with the chip size. For example, as the chip size is larger, the adhesion difference between the surfaces of the two load-bearing structures is larger. In addition, since the liquid 900 is only coated partially on the top surface 1113 of the unqualified chips and there is still a limit for the adhesion differences between the unqualified chips 1112 and the qualified chips 1111 and the second load-bearing structure 1200 caused by the surface characteristic of the thin film 910, the adhesion difference between the surfaces of the two load-bearing structures should not be too large so as to avoid the first adhesion of the first surface 1101 of the first load-bearing structure 1100 being too small which causes the unqualified chips 1112 having the thin film 910 transferred to the second surface 1201 of the second load-bearing structure 1200 along with the qualified chips 1111. In an embodiment, based on the foregoing considerations, the adhesion difference between the surfaces of the first load-bearing structure 1100 and the second load-bearing structure 1200 is in the range between 0.4N and 2.5N.

In the embodiment, if the qualified chips 1111 are attached to the first load-bearing structure 1100 with the top surfaces 1113 upward, the qualified chips 1111 would be attached to the second load-bearing structure 1200 with the attaching surfaces 1115 upward after qualified chips 1111 are transferred by the single-batch transfer method disclosed in the embodiment. Depending on the requirement, if the qualified chips 1111 are re-converted to be with the top surface 1113 upward, all qualified chips 1111 can be transferred to another load-bearing structure in single-batch without changing the corresponding position thereof by the above-mentioned peptization process or adhesion difference. In addition, in order to make the transfer more accurate, the single-batch transfer mechanism can further include a chip positioning mechanism (not shown in the figure), and the chip positioning mechanism can be, for example, an image recognizer which can be used to confirm whether the chips on the load-bearing structure shift before the single-batch transfer. In an embodiment, the chip positioning mechanism is the chip positioning mechanism 1600 in the chip transferring apparatus 1500, and the image recognizer is the CCD 1610.

Figure 4:
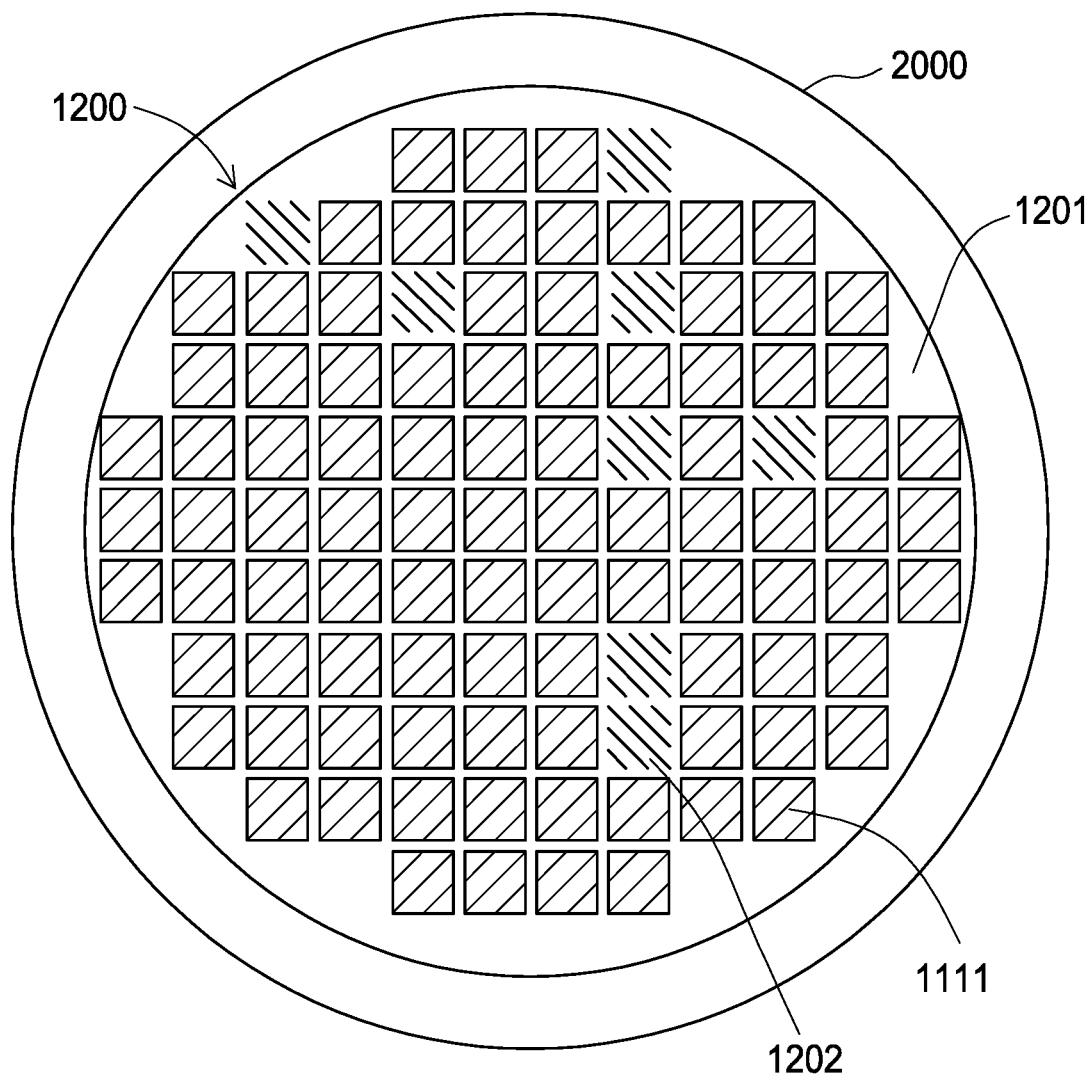
FIG. 4 is a top view of the second load-bearing structure in accordance with a first embodiment of the present disclosure.

FIG. 4 is a top view of the second load-bearing structure 1200 after the unqualified chips 1112 are removed in accordance with the first embodiment of the present disclosure, which includes a metal expansion ring 2000 used to fix the second load-bearing structure 1200. After the process of single-batch transfer of the chips according to the above embodiment, the second surface 1201 of the second load-bearing structure 1200 bears a plurality of qualified chips 1111 and vacancies 1202 corresponding to where the originally unqualified chips 1112 located. Since all of the LED chips 1110 undergo the above-mentioned detection of characteristic values, the wafer map file of the photoelectric characteristic value and the corresponding position of each chip on the first load-bearing structure 1100 is generated. Therefore, through software operation, the wafer map file of the photoelectric characteristic value and the corresponding position of each qualified chips 1111 on the second load-bearing structure 1200 can be obtained. The photoelectric characteristic value of each of the qualified crystal chips 1111 is recorded in the wafer map file which includes the dominant wavelength value of each of the qualified chips 1111.

Figure 5C:
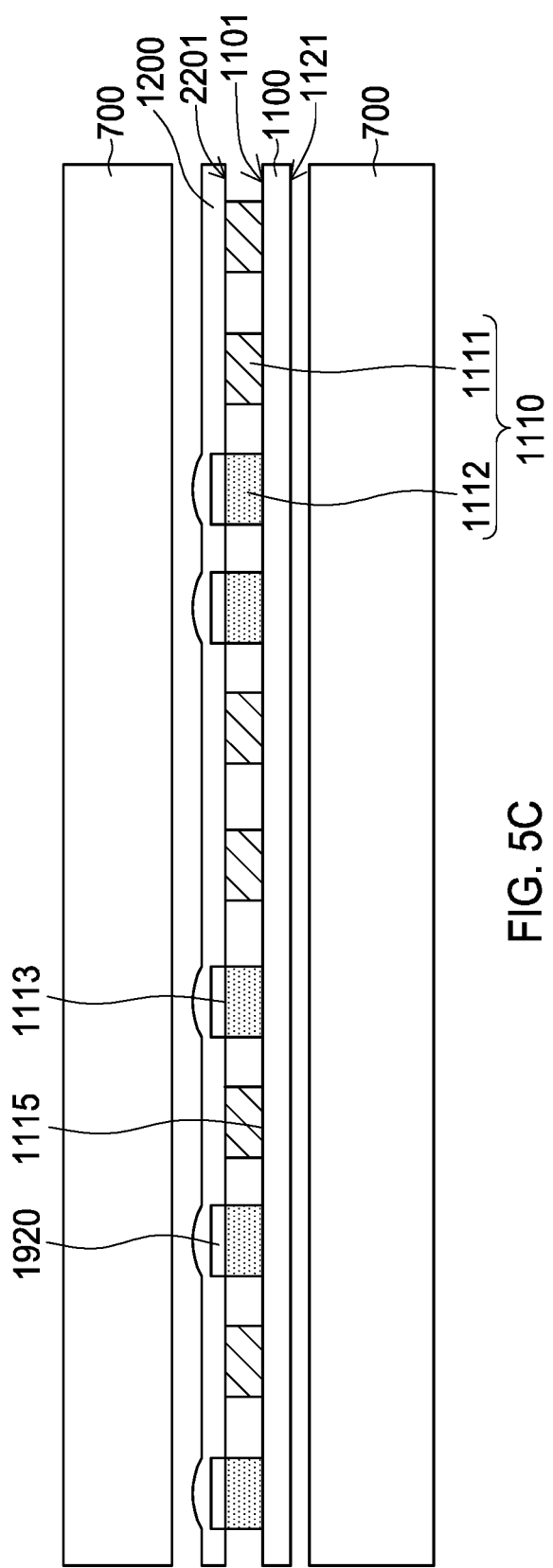

FIGS. 5A-5D show flow charts for single-batch transfer of a plurality of qualified chips 1111 and unqualified chips 1112 in accordance with a second embodiment of the present disclosure. FIG. 5A is a cross-sectional view of the first load-bearing structure 1100 taken along line A-A' in FIG. 2. The second embodiment uses the same chip transferring apparatus 1500 as used in the first embodiment, and the transfer method is described later. As shown in FIG. 5A, the first surface 1101 of the first load-bearing structure 1100 bears a plurality of LED chips 1110 thereon. Each of LED chips 1110 includes a top surface 1113 and a attaching surface 1115 opposite to the top surface 1113, and the LED chips 1110 are attached to the first surface 1101 through the attaching surface 1115. The first load-bearing structure 1100 further includes a back surface 1121 opposite to the first surface 1101. Referring to FIG. 5A, the first load-bearing structure 1100 bears a first portion of the plurality of LED chips categorized as the qualified chip 1111 whose photoelectric characteristic value (for example, dominant wavelength) falls within the qualified range, and a second portion of the plurality of LED chips categorized as the unqualified chip 1112 whose photoelectric characteristic value (for example, dominant wavelength) falls within the unqualified range, i.e. the unqualified chips 1112.

Figure 5D:
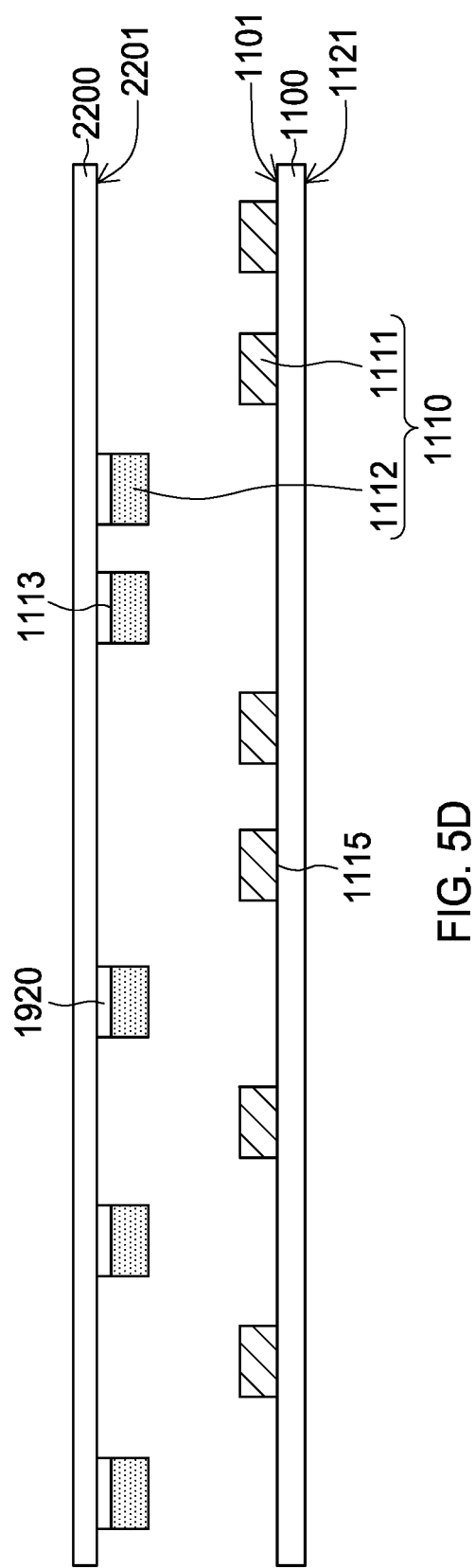

Next, as shown in FIG. 5B, during the process of transferring the plurality of chips, the image recognizer 1610 of the chip positioning mechanism 1600 of the chip transferring apparatus 1500 of the first embodiment, such as a chip locator 1610" in the embodiment, is used to confirm the relative positions of the plurality of LED chips 1110 on the first load-bearing structure 1100, and the computer 1620 is used to construct and apply the wafer map file of the photoelectric characteristic values of the plurality of LED chips 1110 so as to distinguish the positions of the qualified chips 1111 and the unqualified chips 1112 and feed it back to the separation mechanism 1800. The computer 820 of the separation mechanism 1800 sets a path based on the aforementioned wafer map file. As shown in FIG. 5B, the separator 800 of the separation mechanism 1800, such as a liquid coating device in the embodiment, coats a liquid 1910, such as an adhesion enhancement agent, on the top surface 1113 (opposite to the attaching surface 1115) of each of the unqualified chips 1112 according to the path set by the computer 820. The liquid 1910 solidifies on the top surface 1113 of each of the unqualified chips 1112 to form a thin film 1920 whose surface characteristic is different from that of the top surface 1113. Next, referring to FIG. 5C, the second load-bearing structure 2200 is disposed on the top surface 1113 of the LED chips 1110. The second load-bearing structure 2200 has the function of fixing and bearing the chips. For example, the second load-bearing structure 1200 includes a structure with a surface having adhesive material, such as an adhesive tape, formed thereon. In an embodiment, the adhesive tape is selected from a white film tape, a blue film tape or a UV tape. In the embodiment, the blue film tape is used. The second load-bearing structure 2200 includes a second surface 2201 which is adhesive and facing the top surfaces 1113 of the plurality of LED chips 1110 and the first surface 1101 of the first load-bearing structure 1100. In an embodiment, the thin film 1920 includes a surface characteristic different from that of the top surface 1113. In the embodiment, a first adhesion exists between the thin film 1920 and the second surface 2201 of the second load-bearing structure 2200, a second adhesion exists between the top surfaces 1113 of the plurality of LED chips 1110 and the second surface 2201 of the second load-bearing structure 2200, and the first adhesion is stronger than the second adhesion. In an embodiment, a third adhesion exists between the attaching surfaces 1115 of the plurality of LED chips 1110 and the first surface 1101 of the first load-bearing structure 1100, and the third adhesion is weaker than the first adhesion. In an embodiment, the third adhesion is stronger than the second adhesion. As shown in FIG. 5D, when the first surface 1101 of the first load-bearing structure 1100 and the second face 2201 of the second load-bearing structure 2200 are pressed together by the presser 700, the unqualified chips 1112 are attached to the second surface 2201 of the second load-bearing structure 2200 because of the thin film 1920 on the top surfaces 1113 of the unqualified chips 1112 causing the first adhesion between the thin film 1920 and the second surface 2201 of the second load-bearing structure 2200 stronger than the third adhesion between the attaching surface 1115 of the LED chips 1110 and the first surface 1101 of the first load-bearing structure 1100. Therefore, the unqualified chips 1112 would be attached to the second surface 2201 of the second load-bearing structure 2200 in single-batch from the first surface 1101 of the first load-bearing structure 1100 by the presser 700 pressing the first load-bearing structure 1100 and the second load-bearing structure 1200.

Figure 6:
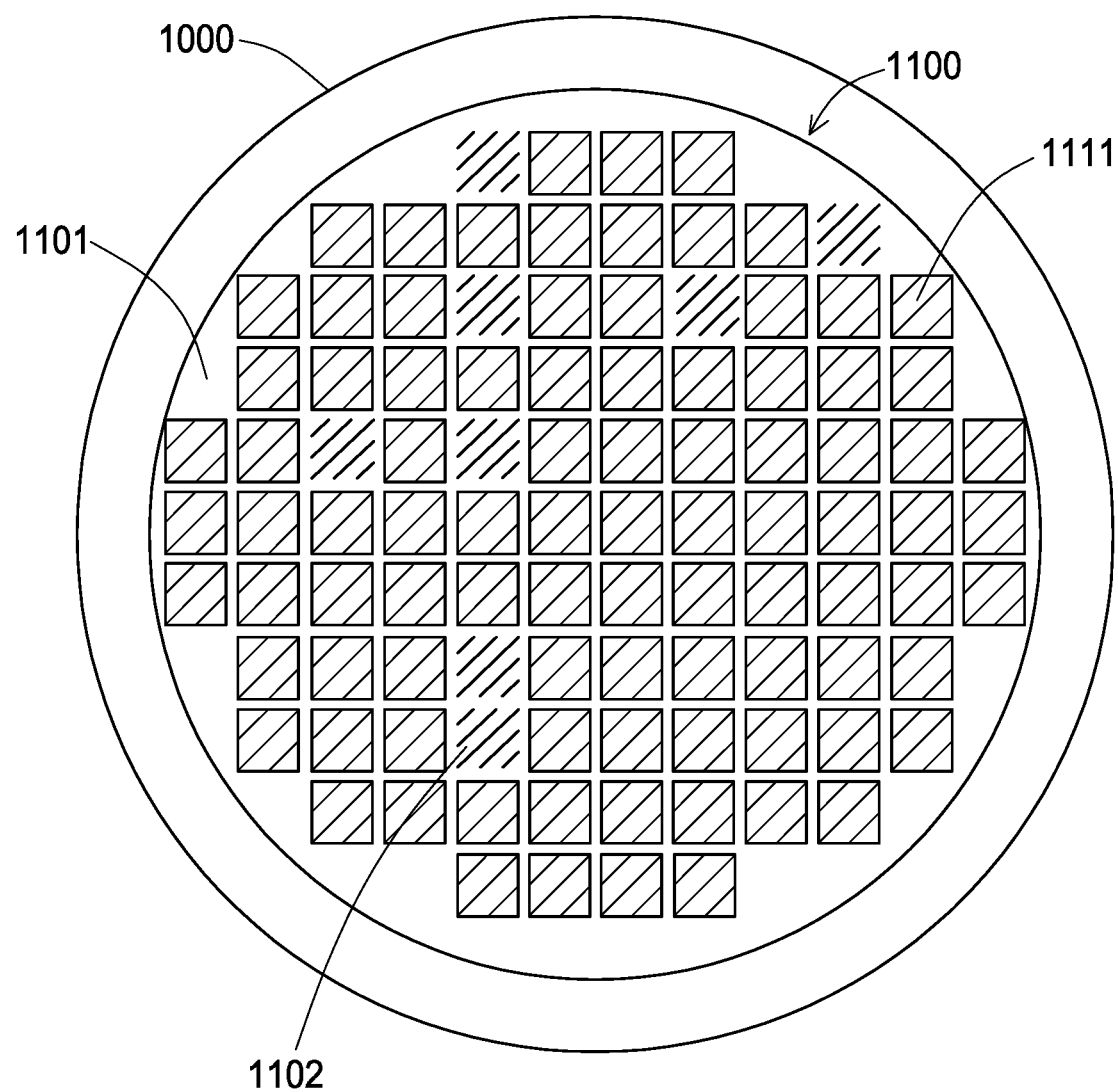
FIG. 6 is a top view of the second load-bearing structure in accordance with a second embodiment of the present disclosure.

After the process of single-batch transfer of the chips according to the above embodiment, the first surface 1101 of the first load-bearing structure 1200 bears a plurality of qualified chips 1111 and vacancies 1202 corresponding to where the originally unqualified chips 1112 located, as shown in FIG. 6. In other words, FIG. 6 is a top view of the first load-bearing structure 1100 after the unqualified chips 1112 is removed in accordance with the second embodiment of the present disclosure, which includes a metal expansion ring 1000 used to fix the first load-bearing structure 1100. Since all of the LED chips 1110 undergo the above-mentioned detection for characteristic values, the wafer map file of the photoelectric characteristic value and the corresponding position of each LED chip 1110 on the first load-bearing structure 1100 is generated. Therefore, after the unqualified chips 1112 are removed, the wafer map file of the photoelectric characteristic value and the corresponding position of each qualified chips 1111 on the first load-bearing structure 1100 can be obtained. The photoelectric characteristic value of each of the qualified crystal chips 1111 are recorded in the wafer map file which includes the dominant wavelength value of each of the qualified chips 1111.

Figure 7:
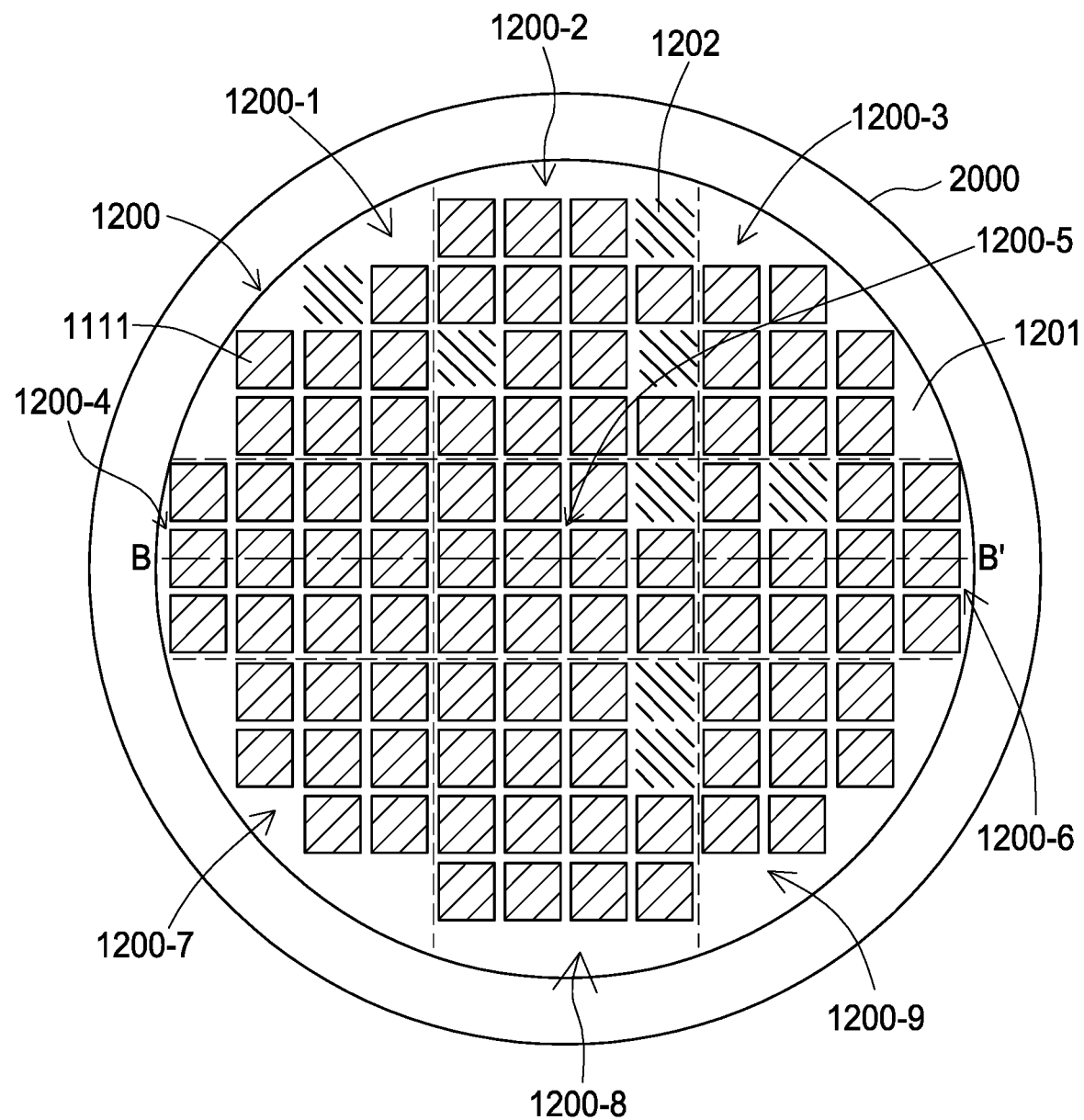
FIG. 7 is a top view of the second load-bearing structure in accordance with a third embodiment of the present disclosure.
Figure 8:
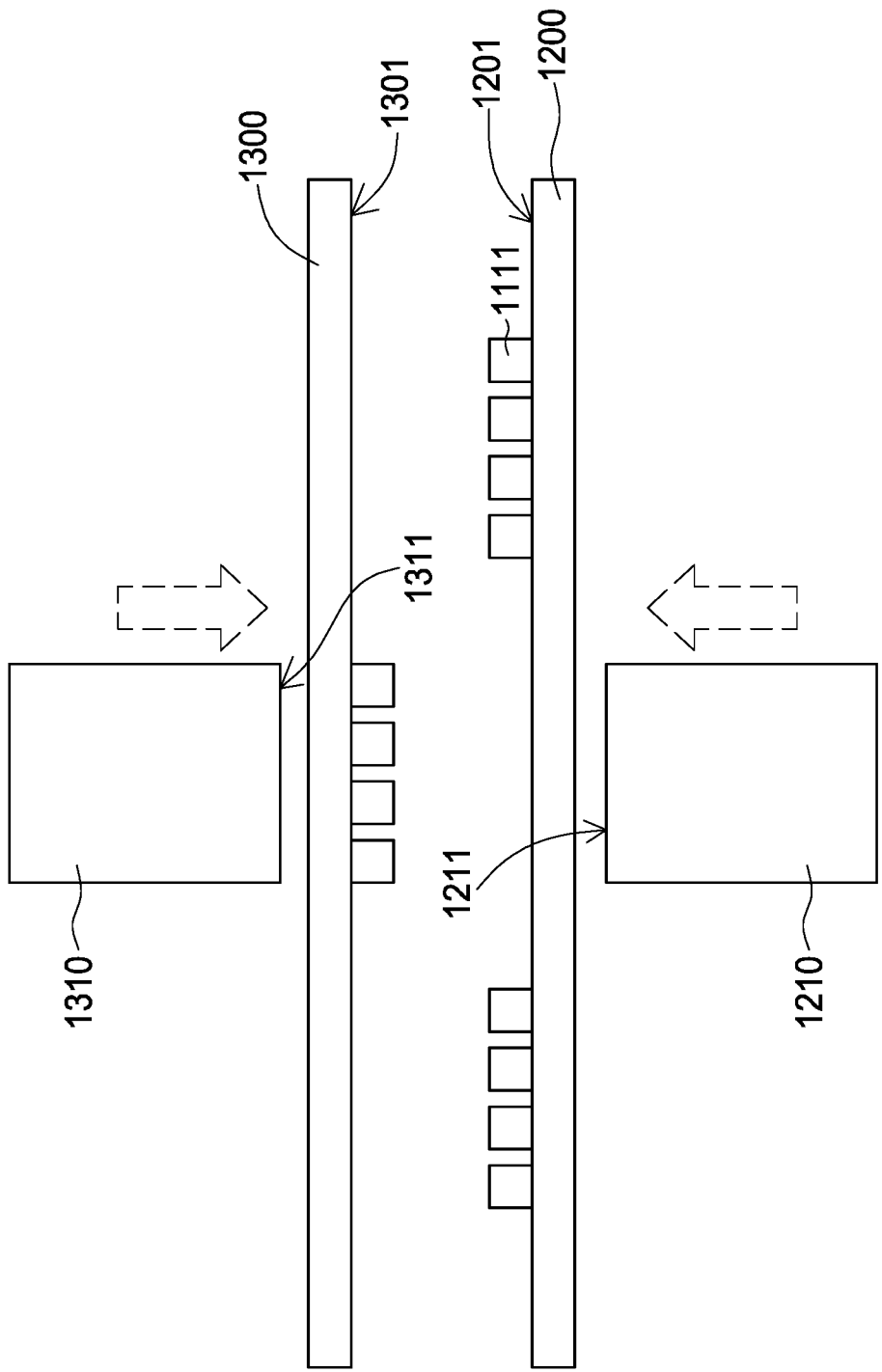
FIG. 8 is a portion view of a chip transferring apparatus in accordance with the third embodiment of the present disclosure.

In an embodiment of the present disclosure, the qualified chips selected by the above-mentioned single-batch transfer method can be further transferred and sorted. FIGS. 7 and 8 show a chip-block transferring and sorting method in accordance with the third embodiment of the present disclosure. In the embodiment, the description of the block transferring and sorting is illustrated by taking the qualified chips after transferred and sorted according to the first embodiment as an example. The sorting method of the qualified chips is not limited thereto, and the conventional transferring and sorting method can also be used as an alternative. Referring to FIG. 7, the qualified chips 1111 after transferred are disposed on the second load-bearing structure 1200. The qualified chips 1111 on the second load-bearing structure 1200 can be categorized based on the photoelectric characteristic values in accordance with the shipping requirements. Taking the blue LED chips 1110 whose emitting wavelength is between 440 nm and 460 nm as an example, the dominant wavelength can be further divided into eight categories, including a first category whose dominant wavelength is between 447.5 nm and 450 nm, a second category whose dominant wavelength is between 445 nm and 447.5 nm, a third category whose dominant wavelength is between 442.5 nm and 445 nm, a fourth category whose dominant wavelength is between 440 nm and 442.5 nm, a fifth category whose dominant wavelength is between 450 nm and 452.2 nm, a sixth category whose dominant wavelength is between 452.5 nm and 455 nm, a seventh category whose dominant wavelength is between 455 nm and 457.5 nm, and a eighth category whose dominant wavelength is between 457.5 nm and 460 nm. Then, the qualified chips 1111 shown in FIG. 7 are divided into a plurality of sorting blocks according to the dominant wavelengths thereof.

In the embodiment, different from the conventional method of categorizing chips which sorts chips repeatedly, the method of block transferring and sorting is to divide the qualified chips 1111 into nine virtual blocks 1200-1 to 1200-9. In the embodiment, a broken line on the second load-bearing structure 1200 represents the corresponding boundary line between the blocks. Each block includes 7 to 14 qualified chips 1111. In an embodiment, since the epitaxial growth and chip process of the LED have certain stability and quality, all chips or the chips locating at the neighborhood should have similar photoelectric characteristic values. Therefore, based on the wafer map file, the photoelectric characteristic values of the plurality of qualified crystal chips 1111 in each block can be averaged and calculated to obtain an average photoelectric characteristic value of each block. Taking the dominant wavelength of the embodiment as an example, the average photoelectric characteristic values of nine dominant wavelengths of nine virtual blocks 1200-1 to 1200-9 can be calculated. Next, according to the aforementioned categories in ranges of the dominant wavelengths, the plurality of qualified chips in each block can be categorized into different categories by ranges of dominant wavelengths according to the average photoelectric characteristic values thereof. Depending on the requirements, the size and the shape of each block can be the same or different.

In an embodiment, when the qualified chips 1111 are divided into nine virtual blocks 1200-1 to 1200-9, each block includes 7 to 14 qualified chips 1111. Based on the fact that the plurality of qualified chips in the same region includes the similar photoelectric characteristics, according the wafer map file, in each block, a few chips whose photoelectric characteristic values are different from that of most chips are removed, and then the chips with the similar photoelectric characteristic values are left on the second load-bearing structure 1200. For example, the photoelectric characteristic values (dominant wavelength) of 5 out of 7 chips in the block 1200-1 fall within the range between 447.5 nm and 450 nm, and the other 2 chips whose photoelectric characteristic values do not fall within the range are removed manually or by machine. Next, according to the aforementioned categories in ranges of the dominant wavelengths, the plurality of qualified chips in each block can be categorized into the different categories by ranges of dominant wavelengths according to the average photoelectric characteristic values thereof. Details will be described later. Depending on the requirements, the size and the shape of each block can be the same or different.

After the average photoelectric characteristic value of the plurality of the qualified chips 1111 are categorized, the image recognizer 1610 of the chip positioning mechanism 1600 of the chip transferring apparatus 1500 mentioned in the above embodiment, such as a chip locator in the embodiment, is used to confirm the corresponding positions of the plurality of qualified chips 1111 on the second load-bearing structure 1200, and the computer 1620 is used to construct the wafer map file of the photoelectric characteristic values of the plurality of qualified chips 1111 and feed it back to the separation mechanism 1800. The computer 820 of the separation mechanism 1800 sets a path according to the aforementioned wafer map file. FIG. 8 shows a partial cross-sectional view taken along B-B' in the FIG. 7 with the chip transferring apparatus in accordance with the third embodiment of the present disclosure. As shown in FIG. 8, the basic structure of the chip transferring apparatus in the embodiment is similar to that of the chip transferring apparatus 1500 mentioned in the first embodiment. The difference is that the second load-bearing structure 1200 includes a second load-bearing structure mount 1210. The above-mentioned second load-bearing structure 1200 which is divided into nine virtual blocks 1200-1 to 1200-9 is disposed on the second load-bearing structure mount 1210. The second load-bearing structure 1200 includes the second surface 1201 upward which used to bear the qualified chips 1111 thereon. A third load-bearing structure 1300 is disposed on the second surface 1201. For example, the third load-bearing structure 1300 includes a structure with a surface having adhesive material thereon, such as a white film tape, a blue film tape or a UV tape. In the embodiment, the blue film tape is used. The third load-bearing structure 1300 includes a third surface 1300 with an adhesion corresponding to the second surface 1201. In the embodiment, the third load-bearing structure 1300 includes a third load-bearing structure mount 1310 which is disposed on the side opposite to the third surface 1300. The chip transferring apparatus further includes a relative image recognizer (not shown in the figure) which is used to detect the positions of the load-bearing structure mounts 1210 and 1310 relative to the load-bearing structures 1200 and 1300, and move or adjust the positions of the second load-bearing structure mounts 1210 and the third load-bearing structure mounts 1310 relative to the second the load-bearing structure 1200 and the third the load-bearing structure 1300 according to the detection results.

Here, the second load-bearing structure mounts 1210 and the third load-bearing structure mounts 1310 are, for example, the above-mentioned pressers 700 of the chip transferring apparatus 1500, which respectively includes flat pressing faces 1211 and 1311 opposite to each other. The area and size of at least one of the pressing faces 1211 and 1311 match those of the virtual blocks 1200-1 to 1200-9. In an embodiment, the area of pressing face 1211 and/or the pressing face 1311 can be larger than or equal to that of the virtual blocks 1200-1 to 1200-9 to facilitate subsequently transferring the plurality of qualified chips 1111 in the block. Since the size and shape of the virtual blocks can be different, the second load-bearing structure mount 1210 and the third load-bearing structure mount 1310 can be correspondingly replaced according to the size and shape of the virtual blocks to meet the size and shape of different blocks. In the embodiment, the load-bearing structure mount 1210 with the pressing faces 1211 whose size and shape are the same as those of the virtual block 1200-5 and the third load-bearing structure mount 1310 with the pressing faces 1311 whose size and shape are the same as those of the virtual block 1200-5 can be selected, and after detected by the relative image recognizer, the pressing faces 1211 and 1311 are moved to the position corresponding to the virtual block 1200-5 and pressed together. By confirming with the relative image recognizer, the accuracy of the pressers 700, i.e. the load-bearing structure mounts 1210 and 1310, relative to the second surface 1201 and the third surface 1301 is confirmed, so that the second surface 1201 and the third surface 1301 are pressed flatly with each other. When the second load-bearing structure mount 1210 and the third load-bearing structure mount 1310 are pressed up and down, the plurality of qualified chips 1111 in the block 1200-5 on the second surface 1201 of the second load-bearing structure 1200 can be transferred to the third face 1301 of the third load-bearing structure 1300 in single-batch by the above-mentioned peptization process or adhesion difference. After repeating the above-mentioned method, the plurality of qualified chips 1111 in the block can be transferred from the second surface 1201 of the second load-bearing structure 1200 to the third surface 1301 of the third load-bearing structure 1300 one block by one block. Therefore, although the size and area of the virtual blocks 1200-1 to 1200-9 can be chosen according to requirements, such as the chips size, in order to increase the efficiency of transferring virtual blocks and reduce the number of replacements of the transfer mechanism 1900, each virtual block is divided into the block with the same area or size.

In an embodiment, the number of the third load-bearing structure 1300 can be multiple. For example, the third load-bearing structure 1300 can be the collecting films categorized by the photoelectric characteristic values. Further, the plurality of qualified chips in each block is transferred to the plurality of third load-bearing structure 1300 in single-batch by the above-mentioned chip-block transferring and sorting method to achieve categorizing. In another embodiment, the photoelectric characteristic values include a luminescence, a light-emitting wavelength, an operating voltage, an electric current or the combination thereof. In the embodiment, different third load-bearing structures 1300 are prepared based on the above-mentioned categories in ranges of the dominant wavelengths, and the plurality of qualified chips 1111 in the block, whose average dominant wavelength falls within the same category range, are transferred to the same third load-bearing structures 1300. For example, the first third load-bearing structure 1300 is the collecting film collecting the chips whose dominant wavelengths fall between 447.5 nm and 450 nm. If the average dominant wavelengths of the blocks 12001-1 and 1200-3 in the nine blocks 1200-1 to 1200-9 fall between 447.5 nm and 450 nm, the plurality of qualified chips in these two blocks are transferred to the third load-bearing structure 1300 in single-batch by the above-mentioned single-batch transfer method to complete the sorting of the chips with the same dominant wavelength.

Similarly, the first load-bearing structure 1100 after removing the unqualified chips 1112 of the second embodiment can be correspondingly applied to the chip-block transferring and sorting method of the third embodiment, and then the plurality of qualified chips 1111 is transferred in single-batch to complete categorizing the qualified chips 1111 on the first load-bearing structure 1100.

In another embodiment, the virtual blocks 1200-1 to 1200-9 are directly divided, for example, by cutting the blue file tape with a cutting knife, into nine blocks according to the division of the virtual blocks. In this way, the divided blocks can be transferred to the subsequent different third load-bearing structures 1300 in batches according to the range of the dominant wavelengths through the above-mentioned peptization process or adhesion difference and without changing the relative position between chips in the same block. After repeating several times, the categorization of the chips can be completed as above mentioned.

In the embodiment, the chips are transferred one block by one block. Therefore, it can be understood that after being transferred, the plurality of qualified chips 1111 in a block originally located on the second surface 1201 of the second load-bearing structure 1200 are transferred to the third surface 1310 of third load-bearing structure 1300 in the same corresponding positional relationship. Subsequently, the wafer map file of photoelectric characteristic values of the plurality of chips transferred to the third surface 1301 of the third load-bearing structure 1300 can be obtained through the image recognizer and the computer.

Figure 9:
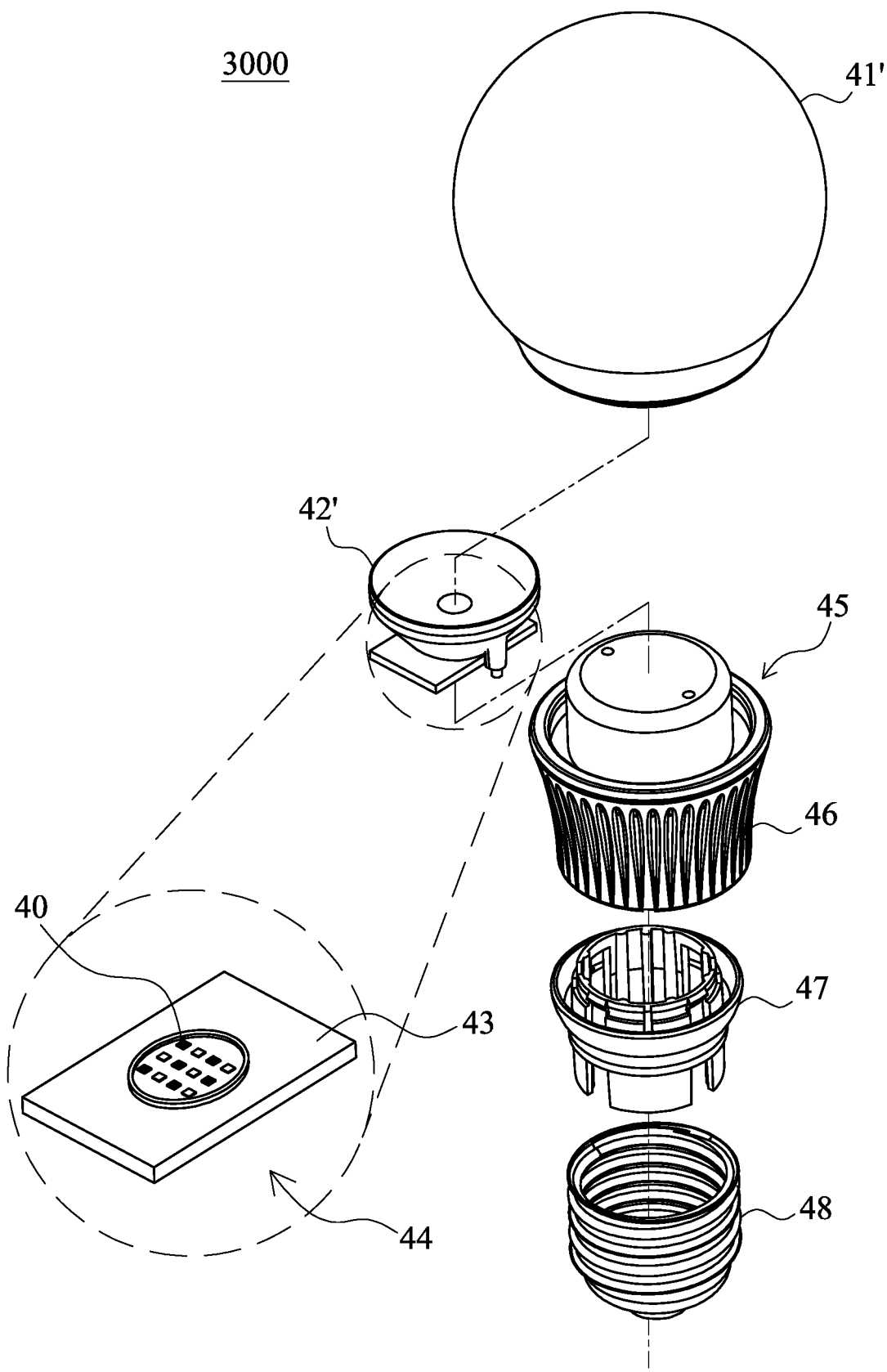
FIG. 9 is an explosion diagram of the optoelectronic system in accordance with the fourth embodiment of the present disclosure.

According to the structure and process disclosed in the aforementioned embodiment, the technology of the present disclosure can be further applied to the structures of different kinds of optoelectronic systems, such as illumination device, display device, projecting apparatus or indicating device. FIG. 9 shows an explosion diagram of the optoelectronic system 3000 in accordance with the fourth embodiment of the present disclosure. The optoelectronic system 3000 includes a cover 41', an optical device 42' disposed in the cover 41', a light module 44 coupled to the optical device 42', a mount 45 having heat dissipation fins 46 and used to support the light module 44, a connector 47, and an electrical connector 48, wherein the connector 47 connects the mount 45 and the electrical connector 48. In an embodiment, the connector 47 can be integrated into the mount 45, which means the connector 47 is a portion of the mount 45. The light module 44 includes a carrier 43 and a plurality of semiconductor devices 40 disposed on the carrier 43, wherein the semiconductor devices 40 can be the qualified chips 111 after transferred and sorted according the aforementioned embodiments. In an embodiment, the plurality of semiconductor devices 40 is transferred to the carrier 43 by the transferring and sorting method of the aforementioned embodiments. The optical device 42' can optionally include a refraction structure, a reflection structure, a diffusion structure, a guiding structure, or the combination thereof in order to extract the light emitted by the semiconductor devices 40 out from the cover 41', or adjust the optical effect according to the application requirements of the optoelectronic system 3000.

Figure 10:
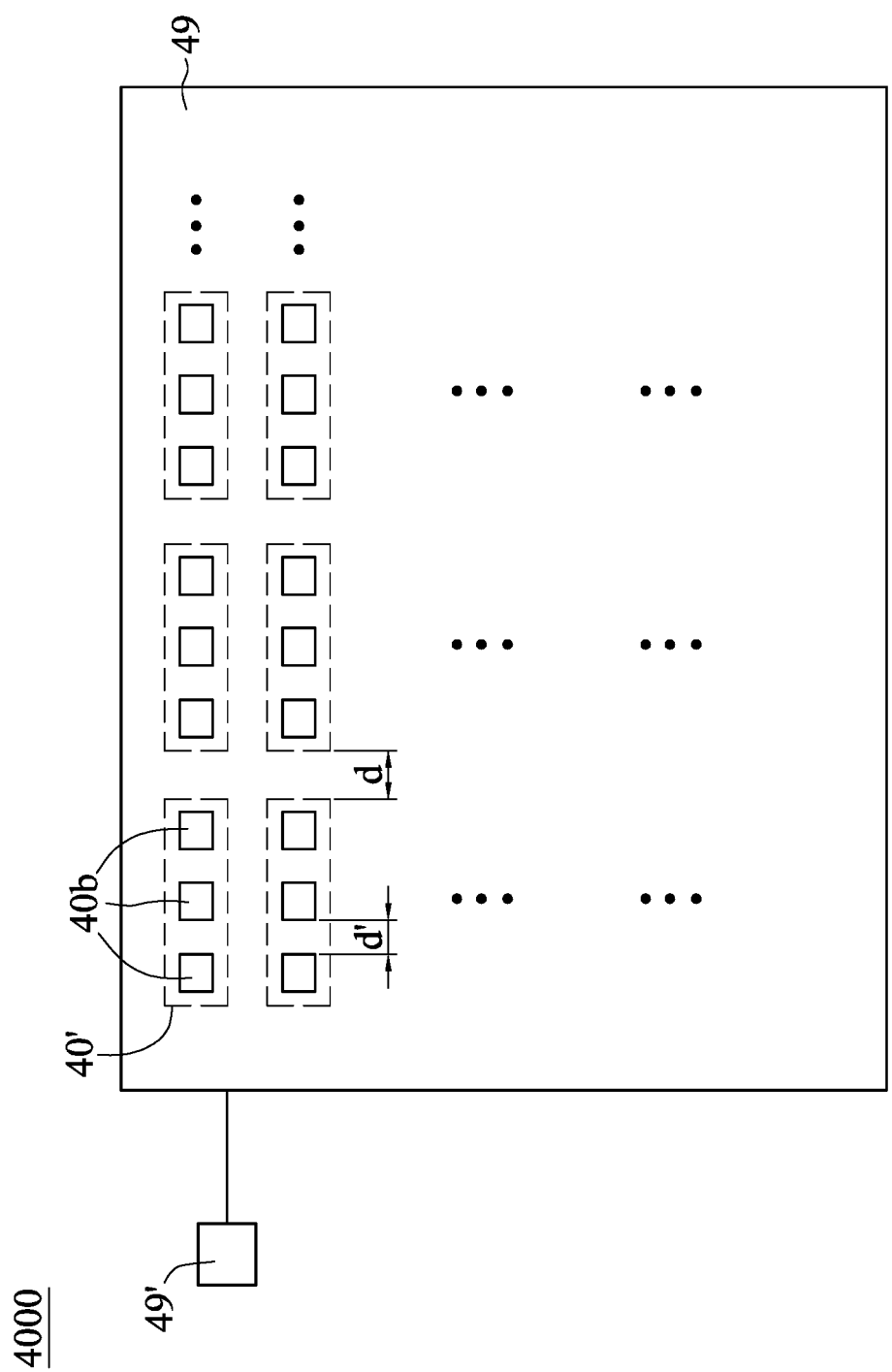
FIG. 10 is an optoelectronic system in accordance with the fifth embodiment of the present disclosure.

FIG. 10 shows an optoelectronic system 4000 in accordance with the fifth embodiment of the present disclosure. The optoelectronic system 4000 can be an LED display device, including a backplane 49, a plurality of picture elements 40' disposed on and electrically connected to the backplane 49, and a control module 49' electrically connected to the backplane 49 and the plurality of picture element s 40', wherein each of the plurality of picture elements 40' includes one or more semiconductor device 40b, such as the qualified chips 111 after transferred and sorted according the aforementioned embodiments. In an embodiment, the optoelectronic system 4000 includes a plurality of control modules 49' respectively corresponding to and connected to the plurality of picture elements 40'. In an embodiment, the semiconductor devices 40b are transferred by the transferring and sorting method of the aforementioned embodiments. The semiconductor devices 40b are controlled simultaneously or separately by one or more control modules 49'. In the embodiment, through the controlling of the control modules 49', the luminous intensity and timing of the three semiconductor devices 40b in one picture element 40' can be separately controlled. In the picture element 40', the first semiconductor device 40b emits a red light, the second semiconductor device 40b emits a green light, and the third semiconductor device 40b emits a blue light. In an embodiment, the plurality of semiconductor devices 40b can emit the light with the same color, such as blue light. In an embodiment, in the picture element 40', the first semiconductor device 40b includes a LED or a laser diode(LD) emitting a blue light or an UV light, which is covered by a red wavelength converting material, such as red phosphor or red quantum dot material. The first semiconductor device 40b emits a red light by exciting the red wavelength converting material with the blue light or the UV light of the light emitting device. The second semiconductor device 40b includes a LED or a LD emitting a blue light or an UV light, which is covered by a green wavelength converting material, such as green phosphor or green quantum dot material. The second semiconductor device 40b emits a green light by exciting the green wavelength converting material with the blue light or the UV light of the light emitting device. The third semiconductor device 40b includes a LED or LD emitting a blue light or an UV light, which is covered by a blue wavelength converting material, such as blue phosphor or blue quantum dot material. The third semiconductor device 40b emits a blue light by exciting the blue wavelength converting material with the blue light or the UV light of the light emitting device. The semiconductor devices 40b can be disposed on the backplane 49 in a matrix, for example, in a row and/or in a column, and can be arranged in a regular or irregular manner. In an embodiment, a distance d preferably between 100 μm and 5 mm exists between any two adjacent picture elements 40', and a distance d' preferably between 100 μm and 500 μm exists between any two adjacent semiconductor devices 40b within one picture element 40'.

The principle and the efficiency of the present application illustrated by the embodiment above are not the limitation of the application. Any person having ordinary skill in the art can modify or change the aforementioned embodiments. Therefore, the protection range of the rights in the present application will be listed as the following claims.

What is claimed is:

1. A chip transferring method, comprising
providing a plurality of chips on a first load-bearing structure;
measuring a photoelectric characteristic value of each of the plurality of chips;
categorizing the plurality of chips into a first portion chips and a second portion chips according to the photoelectric characteristic value of each of the plurality of chips, wherein each of the first portion chips respectively comprises a first photoelectric characteristic value which falls within a defined photoelectric characteristic value range, and each of the second portion chips respectively comprises a second photoelectric characteristic value which does not fall within the defined photoelectric characteristic value range;
providing a second load-bearing structure;
weakening a first adhesion between the first portion chips and the first load-bearing structure or between the second portion chips and the first load-bearing structure; and
transferring the first portion chips after weakening the first adhesion between the first portion chips and the first load-bearing structure or transferring the second portion chips after weakening the first adhesion between the second portion chips and the first load-bearing structure to the second load-bearing structure,
wherein the defined photoelectric characteristic value range is divided into a plurality of sub-ranges.

2. The chip transferring method according to claim 1, wherein the first load-bearing structure comprises a first surface and a back surface, each of the plurality of chips respectively comprises an attaching surface and attaches the first surface with the attaching surface, and the first adhesion is between the first surface and the attaching surface.

3. The chip transferring method according to claim 2, wherein the step of weakening the first adhesion comprises a peptization process.

4. The chip transferring method according to claim 3, wherein the peptization process comprises coating a peptizer on the first surface or the back surface.

5. The chip transferring method according to claim 3, wherein the peptization process comprises illuminating the first load-bearing structure with UV light.

6. The chip transferring method according to claim 1, wherein after the step of transferring, further comprising dividing the first portion chips into a plurality of virtual blocks according to the photoelectric characteristic value, and each of the plurality of virtual blocks comprises multiple chips of the plurality of chips.

7. The chip transferring method according to claim 6, further comprising transferring the first portion chips in one of the virtual blocks to a third load-bearing structure in single-batch.

8. The chip transferring method according to claim 7, further comprising transferring the first portion chips in another one of the virtual blocks to the third load-bearing structure, wherein the first portion chips in the one of the virtual blocks and the first portion chips in the another one of the virtual blocks comprise similar photoelectric characteristic values.

9. The chip transferring method according to claim 7, wherein the first portion chips in the one of the virtual blocks are transferred to the third load-bearing structure in single-batch by a transfer mechanism.

10. The chip transferring method according to claim 9, wherein the transfer mechanism comprises a pressing face, and an area of the pressing face is larger than or equal to an area of the one of the virtual blocks.

11. The chip transferring method according to claim 7, wherein the first load-bearing structure, the second load-bearing structure or/and the third load-bearing structure comprises a white film tape, a blue film tape or a UV tape.

12. The chip transferring method according to claim 6, further comprising dividing the first load-bearing structure or the second load-bearing structure, where the first portion chips disposed on, into a plurality of blocks according to the plurality of virtual blocks.

13. The chip transferring method according to claim 12, wherein after the step of dividing the first portion chips into the plurality of virtual blocks, further comprising calculating an average photoelectric characteristic value range of each of the plurality of virtual blocks.

14. The chip transferring method according to claim 13, further comprising removing the chips of each of the plurality of virtual block whose photoelectric characteristic value do not fall within the average photoelectric characteristic value range of each of the plurality of virtual blocks.

15. The chip transferring method according to claim 13, further comprises categorizing the plurality of virtual blocks into the plurality of sub-ranges according to the average photoelectric characteristic value range of each of the plurality of virtual blocks.

16. The chip transferring method according to claim 1, wherein the photoelectric characteristic value comprises a luminescence, a light-emitting wavelength, an operating voltage or an electric current.

17. The chip transferring method according to claim 1, further comprising fixing the first load-bearing structure on a metal expansion ring to expand the first load-bearing structure.

18. The chip transferring method according to claim 1, further comprising forming a wafer map file based on a position of each of the plurality of chips and the photoelectric characteristic value of each of the plurality of chips.

19. The chip transferring method according to claim 1, further comprises changing a second adhesion between the first portion chips and the second load-bearing structure or between the second portion chips and the second load-bearing structure.

20. The chip transferring method according to claim 19, wherein an adhesion difference between the first adhesion and the second adhesion is between 0.4N and 2.5N.

* * * * *